Dec. 26, 1967 MINORU NAGATA 3,360,736

TWO INPUT FIELD EFFECT TRANSISTOR AMPLIFIER

Filed Sept. 9, 1964 2 Sheets-Sheet 1

INVENTOR.
Minoru Nagata

BY

INVENTOR.
Minoru Nagata

BY

Wenderoth & Wenderoth

United States Patent Office 3,360,736
Patented Dec. 26, 1967

3,360,736
TWO INPUT FIELD EFFECT TRANSISTOR AMPLIFIER

Minoru Nagata, Kodaira-shi, Japan, assignor to Kabushiki Kaisha Hitachi Seisakusho, Tokyo-to, Japan, a joint-stock company of Japan Filed Sept. 9, 1964, Ser. No. 395,202
Claims priority, application Japan, Sept. 10, 1963, 38/47,820
2 Claims. (Cl. 330—38)

This invention relates to amplifier circuits in which field effect transistors are used, and more particularly it relates to a new input field effect amplifier and a combination amplifier circuit each producing an output which is proportional to the difference or sum of two inputs.

As is known, a field-effect transistor has a function to control the current flowing through the channel (current path) by means of an electric field. Various forms of construction of the transistor have been proposed. The most fundamental field-effect transistor has a construction wherein a thin n-type layer for constituting a channel is formed on a p-type semiconductor and provided on one end thereof with a source electrode and on the other end with a drain electrode, and a gate electrode is provided on the p-type semiconductor. The magnitude of the current flowing through the channel is controlled by controllably adjusting the magnitude of a voltage applied across the source and gate electrodes.

In a field-effect transistor of the above described construction, a p-n junction is interposed between the channel and the gate electrode. In contrast with this construction, there has been proposed a transistor of a construction wherein, for example, an n-type channel layer is formed on a p-type semiconductor, source and drain electrode are provided on its two ends respectively, and a gate electrode is provided over the channel layer with an insulator film interposed therebetween. In this transistor, the channel current is controlled in a manner similar to that described hereinabove by means of a voltage applied across the source electrode and the gate electrode. Since a gate electrode is deposited on an insulator film, the polarity of the control voltage applied to the gate electrode may be either positive or negative, and the input resistance is substantially high.

It is to be observed that, in a field-effect transistor so arranged as above described to apply a control electric field through an insulator film to the channel layer, the channel layer is formed on a semiconductor substrate (for example, a wafer) of opposite conductivity (for example, if the channel is of n-type conductivity, the substrate is of p-type conductivity). Then it will be apparent that it is possible to control the current in the channel layer also by applying a voltage across the semiconductor wafer and the source electrode.

That is, by providing, in addition to a first gate electrode provided over an insulator film, a second gate electrode on a semiconductor substrate in which a channel layer and a pn junction are formed, a field-effect tetrode transistor having two control electrodes is obtained. These two control electrodes have different input impedances and conductances relative to each other as will be described hereinafter.

It is an object of the present invention to provide extremely simple amplifier circuits wherein a field-effect transistor having two input electrodes is used, and the sum or difference of two input signals is produced as the output.

It is another object of the invention to provide, through the use of an amplifier circuit of the above stated character, a direct-current amplifier having low drift and high frequency response, particularly a direct-current amplifier which is highly suitable for use as an operational amplifier in devices such as analog computers.

The nature, principle, and details of the invention, as well as other objects and advantages thereof, will best be understood by reference to the following detailed description, taken in conjunction with the accompanying drawings in which like parts are designated by like reference characters, and in which.

Figure 3:
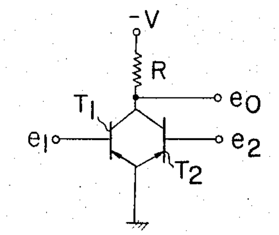
Figure 4:
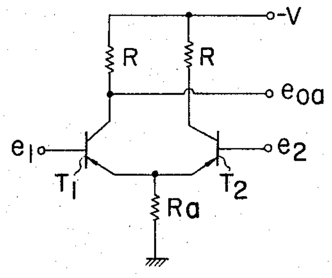
Figure 5:
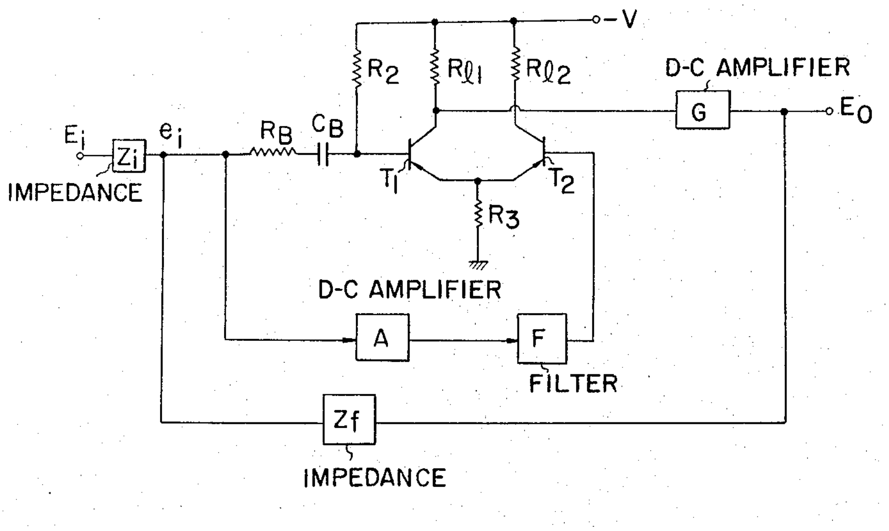
Figure 6:
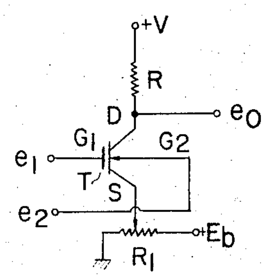
Figure 7:
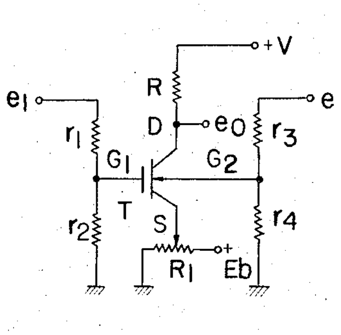
Figure 8:
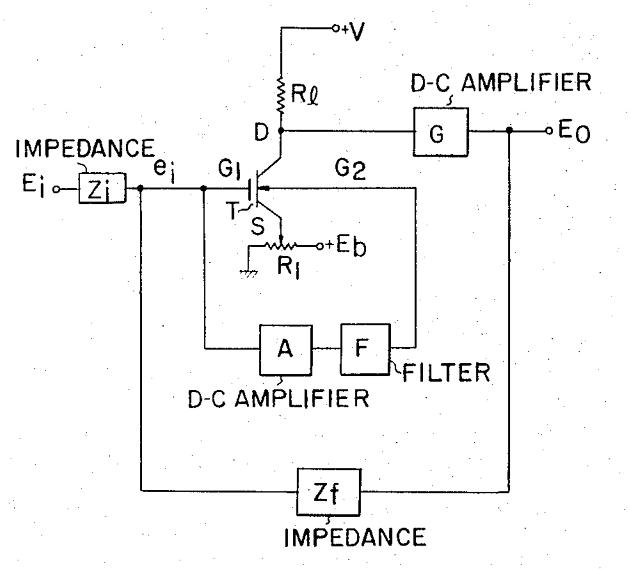

FIGS. 3, 4, and 5 are circuit diagrams showing examples of known amplifier circuits; and FIGS. 6, 7, and 8 are circuit diagrams respectively showing embodiments of the amplifier circuit according to the invention.

Figure 1:
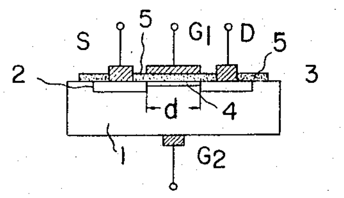
FIG. 1 is a schematic sectional view showing the arrangement and construction of a field-effect tetrode transistor with two input electrodes which is suitable for use in the amplifier circuits of the invention.

Referring to FIG. 1, the example of the aforementioned field-effect tetrode transistor shown therein comprises essentially a p-type semiconductor substrate 1 (for example, a silicon wafer), n-type regions 2 and 3 formed in one surface of the substrate 1 with a distance $d$ therebetween, a channel (n-type) formed between the two n-type regions 2 and 3, an insulator film 5 (for example, of $SiO_2$) disposed to cover the said surface of the substrate 1, including the regions 2 and 3 and channel 4, source and drain electrodes S and D formed to be in ohmic contact with the n-type regions 2 and 3, respectively, a first gate $G_1$ deposited on the insulator layer 5 in a manner to cover the channel 4, and a second gate $G_2$ formed on the semiconductor substrate 1.

Figure 2:
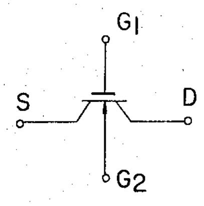
FIG. 2 is a symbolic diagram representing the transistor shown in FIG. 1.

The two n-type regions 2 and 3 can be formed in a symmetrical configuration. Therefore, the source and drain electrodes S and D can be mutually exchanged. This field-effect tetrode transistor may be symbolically represented as shown in FIG. 2.

The present invention provides simple amplifier circuits wherein the above described field-effect transistor is used to produce an output which is the sum or difference of two input signals.

An ordinary circuit to produce an additive output of two inputs is illustrated in FIG. 3. In this circuit, two bipolar transistors $T_1$ and $T_2$ are connected in parallel, and, when inputs $e_1$ and $e_2$ are respectively applied to the bases of these transistors, the output $e_o$ is proportional to the sum $(e_1+e_2)$. Inversely, in order to produce an output $e_{oa}$ proportional to the difference between the inputs $e_1$ and $e_2$, a differential amplifier circuit of the circuit arrangement shown in FIG. 4 has been generally used.

Such a differential or adder circuit has the disadvantage of low input impedance of the transistors $T_1$ and $T_2$ and large current drift. Furthermore, since it is difficult to cause the temperature characteristics of the transistors $T_1$ and $T_2$ to coincide exactly, drift due to variation of the ambient temperature cannot be avoided. A further disadvantage is that the use of two transistors complicates the circuit arrangement.

By the arrangement of the amplifier circuit of the present invention all of these disadvantages can be eliminated. In one embodiment of the invention as shown in FIG. 6, a field-effect transistor T as shown in FIG. 1 is used, a first input $e_1$ being applied to its first gate electrode $G_1$, and another input $e_2$ being applied to its second gate electrode $G_2$. The source electrode S is connected to a variable resistance $R_1$ for bias, one terminal of which is grounded, and the other terminal of which is connected to a bias voltage source $E_b$. The drain electrode D is connected through a load resistance R to a power supply V for operation, and the output is taken out from one of the terminals of the load resistance R.

It will be obvious that this arrangement results in a simple circuit because it requires only a single amplifying element. Moreover, it has the following effectiveness. Since the first gate $G_1$ is formed on an insulating film, it is possible to cause the input impedance as viewed from the first gate $G_1$ to be of a very high value and the input impedance as viewed from the second gate $G_2$, also to be of a high value of approximately several megohms. Furthermore, by adjusting the bias resistance $R_1$ and suitably selecting the values of the bias voltage applied to the first gate $G_1$ and the bias voltage applied to the second gate $G_2$, it is possible to cause the drift due to ambient temperature variation to be zero or an extremely small value.

Although in this circuit an addition output $e_o$ which is proportional to the sum $e_1+e_2$ is obtained, an output which is proportional to the difference $e_1-e_2$ can be obtained at the output terminal by applying one of the input voltages $e_2$ of the two inputs with a polarity opposite to that of the other input voltage $e_1$.

Furthermore, since the amplifier circuit of this invention has high input impedance, it can be caused to undergo addition operation or differential operation by connecting thereto a voltage divider circuit and using any ratio as desired of the two inputs. A practical example of such an arrangement is illustrated in FIG. 7, in which the input $e_1$, after being voltage divided by resistances $r_1$ and $r_2$, is applied to the first gate electrode $G_1$, and the input $e_2$, after being voltage divided by resistances $r_3$ and $r_4$, is applied to the second gate electrode $G_2$.

The output in this case (drain current $I_D$) can be expressed by the following equation $$i_D=\frac{r_2}{r_1+r_2}g_{m1}e_1+\frac{r_4}{r_3+r_4}g_{m2}e_2$$

where:

$g_{m1}$ is the proportion of variation of $i_D$ with respect to $e_1$; and $g_{m2}$ is the proportion of variation of $i_D$ with respect to $e_2$.

By using a circuit having the unique features as described above, it is possible to provide an operational amplifier suitable for devices such as, for example, an analog computer.

As conductive to a full appreciation of the utility of the present invention in another aspect thereof, the following brief consideration of a conventional circuit of similar kind, presented before description of a preferred embodiment of the present invention, is believed to be useful.

Referring to FIG. 5, the circuit shown therein has transistors $T_1$ and $T_2$. An input signal containing high- and low-frequency components from a terminal $E_1$ is applied to the base of the transistor $E_1$ by way of an operational impedance $Z_i$, resistance $R_B$, and a capacitor $C_B$. The resistance $R_B$ has the function of increasing the input impedance, and the capacitor $C_B$ serves to reduce drift.

On the other hand, the input $e_i$ which has passed through the impedance $Z_i$ passes further through a modulation-type, direct-current amplifier A and a filter F and is applied to the base of the transistor $T_2$.

The emitters of the transistors $T_1$ and $T_2$ are connected at a common junction, between which and ground a resistance $R_3$ is inserted. Furthermore, the collectors of the transistors $T_1$ and $T_2$ are connected to one terminal of load resistances $R_{11}$ and $R_{12}$, respectively. The other terminals $R_{11}$ and $R_{12}$ are connected commonly to a power source V for operation.

A resistance $R_2$ is provided for bias. An output is produced from the collector of the transistor $T_1$ and, after being further amplified by the amplifier G of the succeeding stage, appears at the output terminal. A feedback impedance $Z_f$ for operation is connected between the input and output.

The circuit of the above described arrangement operates in the following manner. The direct-current and low-frequency component of the input signal $E_i$, after being amplified by the modulation-type, direct-current amplifier A, in which the drift is very low, is separated from the modulated wave in the filter F and is amplified by the transistor $T_2$.

The above mentioned amplifier A is an ordinary D-C amplifier of the modulation type which converts input into alternating current by means of a chopper and, after A-C amplification, accomplishes synchronous rectification.

On one hand, the component of relatively high frequency of the input frequency of the input signal, after passing through the capacitor $C_B$, is amplified in the transistor $T_1$ and, after being amplified in a D-C amplifier G together with the output of the transistor $T_2$, is sent out as output. A circuit of such arrangement and operation has a very small drift, which, as is well known, is reduced to $1/G_o$, where $G_o$ is the gain of the circuit of the amplifier A and filter F.

However, in a circuit of this character wherein a bipolar type transistor is used, the base D-C current causes offset and drift. Accordingly, it has been necessary to insert a coupling capacitor $C_B$ in the input side of the differential amplifier so as to prevent this current from flowing into the operational impedances $Z_i$ and $Z_f$. Moreover, since the input impedance of transistor $T_1$ is low, a large capacitance capacitor, for example, an electrolytic capacitor, must be used for the capacitor $C_B$ in order to obtain the required frequency response.

However, if an electrolytic capacitor were used, offset and drift due to its stray current would be introduced. Therefore, the common practice is to use a low-capacitance capacitor of good quality for the capacitor $C_B$ and to insert a resistance $R_B$ in order to obtain the required time constant, but this expedient gives rise to the disadvantage of increased transistor noise.

The low input impedance of the transistor, furthermore, necessitates a capacitor of very high capacitance in order to cause the filter F to have the required frequency response. In order to reduce this capacitance, it is necessary to insert a resistance similar to the resistance $R_B$ into the base circuit of the transistor $T_2$, which expedient is accompanied by the disadvantage of lowered gain.

The present invention contemplates the provision of a circuit in which the above described difficulties are overcome. In one embodiment of the invention as shown in FIG. 8, there is used a field-effect transistor T as shown in FIG. 1. An input $E_i$ through an input impedance $Z_i$ is applied directly to the first gate electrode $G_1$ of this transistor, and an input through the impedance $Z_i$ is applied to the second gate electrode $G_2$ after having been passed through a modulation type D.-C. amplifier A and a filter F. The source electrode S is connected to a bias resistance $R_1$, and the drain electrode D is connected by way of a load resistance $R_e$ to an operational power source V. The other designations indicate similar arrangement as that shown in FIG. 5.

If, in this circuit, the gain $G_o$ of the circuit of the amplifier A and filter F is selected to be positive, that is, so selected as to have the same phase, the input entering the D.-C. amplifier G will be the sum of the amplified inputs of the gate electrodes $G_1$ and $G_2$, and, furthermore, by causing this gain $G_o$ to be of a high value, the drift will be reduced to a remarkable degree.

The circuit of the present invention as described above has the following unique features. Since the input impedance of the transistor T is very high, the input circuit current is extremely low, and the operation is accomplished by voltage similarly as in the case where vacuum tubes are used. Accordingly, there is no possibility of undesirable currents flowing into the impedances $Z_i$ and $Z_f$, and, therefore, the capacitor $C_B$ and resistance $R_B$ can be omitted. As a result, it is possible to reduce offset and drift to a great extent in comparison with that accompanying conventional circuits.

Furthermore, it is possible to use a capacitor of low capacitance within the filter circuit F. In addition, the circuit arrangement is greatly simplified because the resistance $R_B$ and capacitor $C_B$ are unnecessary, and, moreover, only a single transistor is used. A further advantageous feature is that, since there are no capacitor leakage, there is the advantage of excellent holding characteristic in the case, for example, of the application of the circuit to an integrator.

Accordingly, it is to be observed that this amplifier according to the present invention is applicable not only to analog computers but also to a wide range of other uses including, for example, amplifiers such as operational amplifiers and data-logger amplifiers of various instruments and devices such as industrial instruments and scientific instruments.

It should be understood, of course, that the foregoing disclosure relates to only preferred embodiments of the invention and that it is intended to cover all changes and modifications of the examples of the invention herein chosen for the purposes of the disclosure, which do not constitute departures from the spirit and scope of the invention as set forth in the appended claims.

What I claim is:

1. An apparatus for amplifying an input signal including substantially low frequency and high frequency components, which comprises (1) a field effect transistor having (a) a semiconductor substrate of one conductivity type;

(b) a channel layer of opposite conductivity type to that on said semiconductor substrate, a pn junction being formed between said substrate and said layer;

(c) source and drain electrodes provided on said channel layer, spaced apart from each other;

(d) a first gate electrode provided over said channel layer in an electrically insulated manner;

(e) a second gate electrode formed on the substrate;

(2) means for applying said high frequency component of the input signal to one of the two electrodes;

(3) a chopper amplifier having an input and an output;

(4) means for applying said low frequency component of the input signal to said chopper amplifier; and (5) means for applying an output of said chopper amplifier to the other gate electrode, whereby an output signal obtained from said drain electrode is controlled by said high frequency and low frequency components of the input signal.

2. A two input field effect transistor amplifier comprising (1) a field effect transistor having (a) a semiconductor substrate of one conductivity type;

(b) a channel layer of opposite conductivity type to that on said semiconductor substrate, a pn junction being formed between said substrate and said layer;

(c) source and drain electrodes provided on said channel layer, spaced apart from each other;

(d) a first gate electrode provided over said channel layer in an electrically insulated manner;

(e) a second gate electrode formed on the substrate;

(2) first and second divider circuits connected to said first and second gate electrodes respectively; and (3) means for applying two input signals to the first and second gate electrodes through each divider circuit, whereby an output signal obtained from the drain electrode is controlled by said two input signals.

References Cited

UNITED STATES PATENTS

| | | | |
|---|---|---|---|
| 2,791,758 | 5/1957 | Looney | 340—173 |
| 3,010,033 | 11/1961 | Noyce | 307—88.5 |
| 3,056,888 | 10/1962 | Atalla | 307—88.5 |
| 3,102,230 | 8/1963 | Dawon Kahng | 323—94 |
| 3,213,299 | 10/1965 | Rogers | 307—88.5 |
| 3,242,394 | 3/1966 | Biard | 317—235 |
| 3,246,173 | 4/1966 | Silver | 307—88.5 |

JOHN W. HUCKERT, *Primary Examiner.*

R. F. SANDLER, *Assistant Examiner.*